United States Patent [19]

Zhang et al.

[11] Patent Number: 5,966,193
[45] Date of Patent: Oct. 12, 1999

[54] LCD DEVICE HAVING COUPLING CAPACITANCES AND SHIELDING FILMS

[75] Inventors: Hongyong Zhang; Akira Takenouchi, both of Kanagawa; Tadayoshi Miyamoto; Atsushi Yoshinouchi, both of Nara, all of Japan

[73] Assignees: Semiconductor Energy Laboratory Co., Ltd., Kanagawa-ken; Sharp Kabushiki Kaisha, Osaka, both of Japan

[21] Appl. No.: 08/891,697

[22] Filed: Jul. 11, 1997

[30] Foreign Application Priority Data

Jul. 15, 1996 [JP] Japan .................................. 8-205378

[51] Int. Cl.[6] .................................................. G02F 1/1333
[52] U.S. Cl. ................................ 349/110; 349/44; 349/39
[58] Field of Search .................................... 349/110, 111, 349/38, 39

[56] References Cited

U.S. PATENT DOCUMENTS

| | | | |
|---|---|---|---|
| 4,759,610 | 7/1988 | Yanagisawa | 349/162 |
| 4,948,231 | 8/1990 | Aoki et al. | 349/111 |
| 4,984,033 | 1/1991 | Ishizu et al. | 349/111 |
| 5,121,236 | 6/1992 | Ukai et al. | 349/111 |

*Primary Examiner*—William L. Sikes
*Assistant Examiner*—Toan Ton
*Attorney, Agent, or Firm*—Fish & Richardson P.C.

[57] ABSTRACT

This invention is characterized by providing light shield patterning on a TFT substrate for an active matrix type liquid crystal display device. A liquid crystal display device comprising an active matrix circuit using a TFT having a top gate-type structure. The light-shield film are formed under a semiconductor layer and superposed at least one of the source bus line and the gate bus line. A capacitance is formed by the light-shield film and at least a part of the semiconductor layer with an insulating layer interposed therebetween.

10 Claims, 10 Drawing Sheets

LCD DEVICE HAVING COUPLING CAPACITANCES AND SHIELDING FILMS

BACKGROUND OF THE INVENTION

1. Industrial Field of the Invention

The present invention generally relates to a liquid crystal display device (LCD). More particularly, the present invention relates to, in LCDs comprising a pair of substrates disposed opposed to each other to constitute a liquid crystal panel, those having a distinguished future in the arrangement of a light-shield film provided to the substrate carrying thereon a thin film transistor (TFT).

2. Prior Art

Liquid crystal display devices are widely used as display devices of a projection type or of a direct-view type. In particular, a so-called active-matrix drive type LCD comprising pixels that are each driven individually by a TFT is useful to implement a high resolution color display. Excellent display characteristics can be realized by employing the active-matrix drive, because the cross talk among the pixels, which is a problem in a passive matrix display, can be eliminated.

In case of an active-matrix driven LCD, TFTs are provided to one of the pair of glass substrates constituting the liquid crystal panel, and each of the TFTs controls the voltage applied to the corresponding transparent pixel electrode. A TFT is a semiconductor element whose characteristics fluctuate when it is directly irradiated by an external light. Thus, a structure which cuts off external light must be provided to a TFT. Light-shield is particularly important for the protection of a projection type display device, because intense light is irradiated thereto.

On the other hand, the boundary portion of each of the pixels constituting the LCD is often influenced by the electric field of the neighboring pixels in such a manner to allow the light to pass through the portion. To improve the contrast ratio of the display, the light passing through the TFT forming portion should be minimized. Accordingly, there is proposed a structure called "black matrix" (sometimes referred to simply as "BM") to omit the boundary portion from the display area. The black matrix is also used for the purpose of cutting light, because the black matrix itself has a light-shield effect. The black matrix structure or any structure having a simple light-shield effect is provided in the form of a film, and is therefore called as "light-shield film".

Conventionally, a light-shield film (black matrix) has been formed on the substrate disposed opposed to the substrate carrying thereon the TFTs. In such a constitution, however, a precise alignment of the substrates is necessary so that the light-shield film may cover the corresponding TFT, and such a precise alignment consumes time in the assembly process. One might think of forming the light-shield pattern larger as to facilitate the alignment process, but this brings about another problem of losing brightness.

SUMMARY OF THE INVENTION

In view of the above problems, it is an object of the present invention to form the light-shield film on the same substrate that carries thereon the TFT. The light-shield film can be formed on the layer upper or lower than the semiconductor layer. That is, the light-shield film is formed on the final stages of the TFT fabrication process in the former case, whereas in the latter case, it is formed in the initial stages of the process.

Conventionally, a light-shield film had been used only for the purpose of cutting light. From the viewpoint of mass production, however, it is too costly and waste of time to add a film deposition step and etching or patterning steps to the fabrication process only for the accomplishment of such a purpose.

In the light of the aforementioned circumstances, the present invention provides an electrically conductive light-shield film having a structure as such usable as a capacitance for the pixels.

According to an embodiment of the present invention, there is provided a liquid crystal display device characterized in that it comprises an active matrix circuit using a TFT of a top gate-type structure (a structure comprising a semiconductor layer (i.e., an active layer) on a substrate, and having a gate electrode further thereon) and having a light-shield film under the semiconductor layer. Furthermore, at least one of the source bus line and the gate bus line is shielded from light by the light-shield film The structure is also characterized in that main light is incident from the substrate side.

The light-shield film is superposed on a part of the semiconductor layer at the region which is electrically connected to the pixel electrode (drain region) with an insulating layer interposed therebetween. Thus, a capacitance is formed between the light-shield film and the drain by maintaining the electric potential of the light-shield film at a proper value. Because this capacitance is provided in parallel with the capacitance of the pixel electrode (pixel capacitance), it can be used as an auxiliary capacitance (hold capacitance).

As a matter of course, another capacitance that is formed between the semiconductor layer and the gate bus lines in the other lines or other connection lines may be combined as additional capacitance with the capacitance formed between the light-shield film and the semiconductor layer. The thickness of the insulating film provided between the semiconductor layer and the light-shield film is preferably twice as large as that of the gate insulating film of the TFT or greater. The light-shield film is preferably provided wider than the source bus lines and gate bus lines, so that it may shield those bus lines from light. The electric potential of the light-shield film is fixed to a proper value. For instance, the light-shield film is connected to an external terminal of the liquid crystal panel, and a proper voltage is applied thereto externally.

In case a mechanically robust material such as tantalum or titanium is used, the light-shield film can be used as external contact terminals.

From the viewpoint of circuit design, the aperture ratio can be maintained high because the auxiliary capacitance above is formed superposed on the light-shield film.

In the constitution according to the present invention, the light-shield film can be formed in a shape as such that it shields the entire semiconductor layer, or such that only a part is superposed.

In addition to the light-shield film that is provided under the semiconductor layer as described above, another light-shield film (referred to as an "upper layer light-shield film") may be formed on the upper layer of the element. In particular, when the upper layer light-shield film is formed in the TFT portion, stray light incident to the TFT can be reduced to a lowest limit, and is therefore effective to stabilize the operation of the TFT.

In the present case, the upper light-shield film may be electrically conductive or insulating. In case an electrically conductive upper layer light-shield film is used, a capacitance may be formed between the upper layer light-shield film and the pixel electrode. Particularly, by aligning the upper layer light-shield film and the lower layer light-shield film in such a manner that the upper layer is superposed on the lower one, two capacitances can be formed at two different levels while occupying the same position; it is therefore effective for the integration of elements.

DETAILED DESCRIPTION OF THE PRESENT EMBODIMENT

Embodiment 1

Figure 1A:
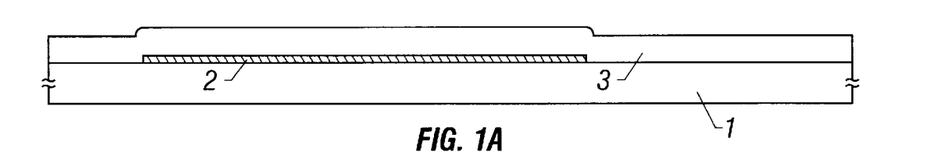
FIGS. 1A to 1E are cross sectional views of the structures of Embodiment 1.
Figure 1B:
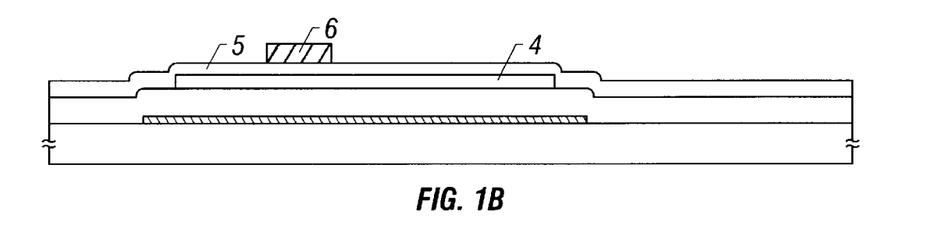
Figure 1C:
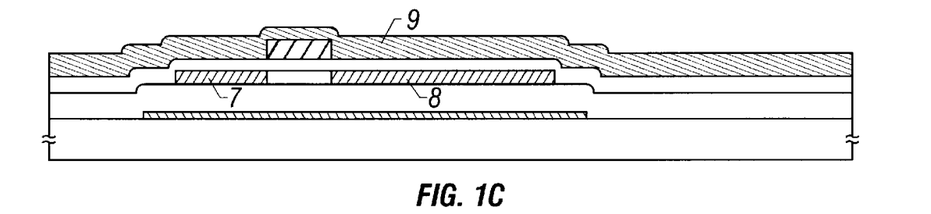
Figure 1D:
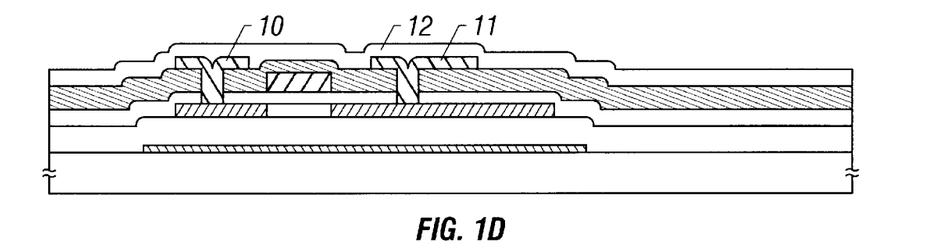
Figure 1E:
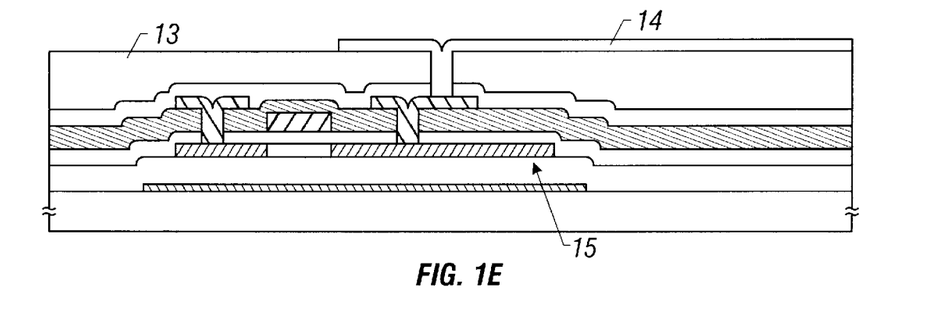
Figure 2A:
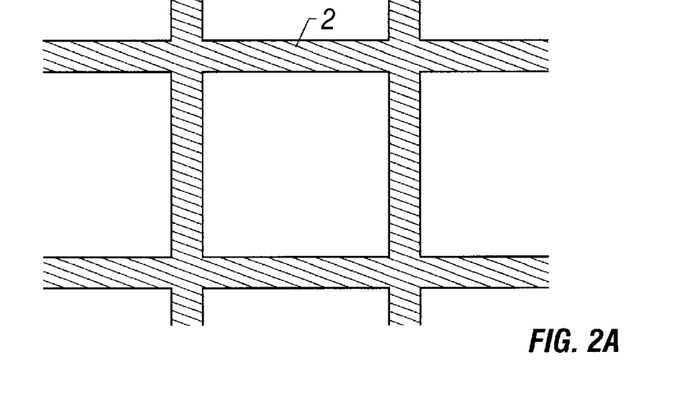
FIGS. 2A to 2C are planar views of the structures of Embodiment 1.
Figure 2B:
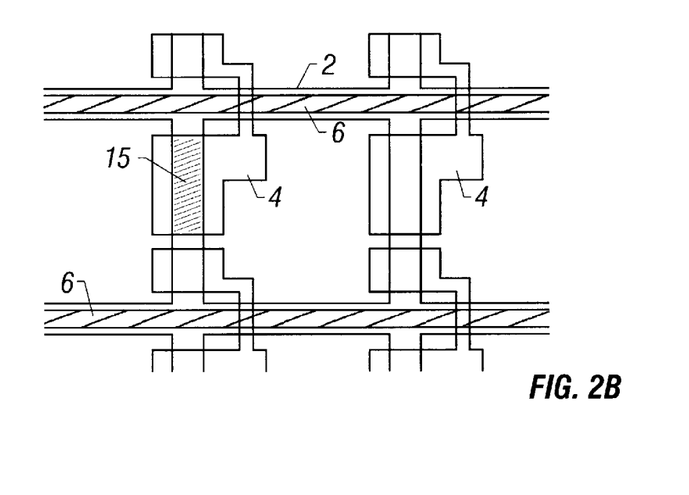
Figure 2C:
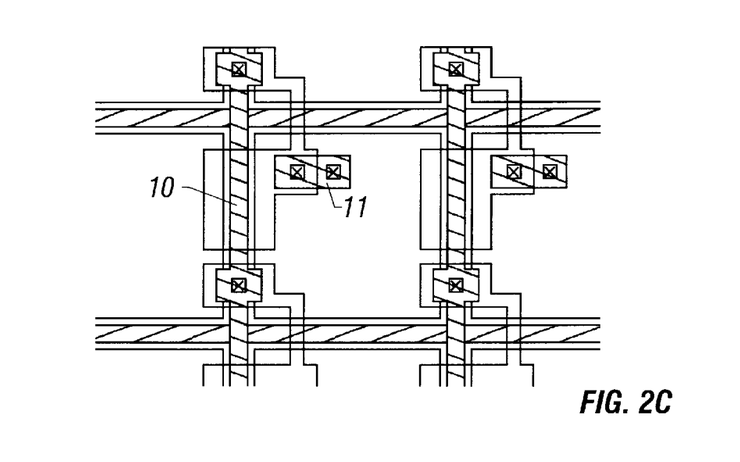

FIGS. 1A to 1E are cross sectional views and FIGS. 2A to 2C are planar views showing the fabrication process according to the present embodiment. A substrate of a transparent glass, for instance, a Corning 7059 glass in this embodiment, is used for the substrate 1. A light-shield film 2 is obtained by forming a tantalum film on the substrate 1 by sputtering to a thickness of from 100 to 3,000 Å, for example, to a thickness of 1,000 Å, and then processing it by employing photolithography. Thus is obtained a structure as is shown in the planar view of FIG. 2A. Referring to FIG. 2A, the patterning of the light-shield film 2 isolates the pixels. The light-shield film 2 is extended to a common electrode (not shown in the figure), and an appropriate voltage is applied externally thereto from the outside of the liquid crystal panel.

Then, a silicon oxide film 3 is formed by means of a known plasma CVD process to a thickness of from 500 to 5,000 Å, for instance, to a thickness of 2,500 Å. The silicon oxide film 3 functions as a base insulating film of the TFT (FIG. 1A).

An amorphous silicon film is formed thereafter by means of a known plasma CVD or low pressure CVD process to a thickness of from 100 to 1,500 Å, more specifically, to a thickness of 500 Å, and is then crystallized by applying a known method such as thermal annealing or laser annealing. Then, the crystallized silicon film is separated into island-like portions by a known photolithography process to obtain an active layer (island-like region) 4.

A silicon oxide film 5 is formed by a known plasma CVD thereafter to a thickness of from 500 to 3,000 Å. The silicon oxide film 5 functions as a gate insulating film of the TFT.

Furthermore, an aluminum (or an aluminum alloy) film is formed by sputtering to a thickness of from 2,000 to 8,000 Å, for instance, to a thickness of 6,000 Å, and the resulting film is processed by utilizing a known photolithography to form a gate electrode and a line (gate bus line) 6 (FIG. 1B).

FIG. 2B shows the top view of the structure obtained to this point. Referring to FIG. 2B, a plurality of gate bus lines 6 are formed in parallel with each other, and are provided on the previously formed patterned tantalum light-shield film 2. The active layer 4 is formed in such a manner that a part 15 thereof may be superposed on the patterned light-shield film 2.

Then, an N-type impurity is introduced into the active layer 4 by employing a known impurity diffusion technique, for instance, ion doping, and by using the gate bus line 6 as a mask. Recrystallization is effected after the doping process by thermal annealing or laser annealing. Thus are obtained a source 7 and a drain 8. In the description below, the term "drain" simply refers to the impurity region to which the pixel electrode is connected.

Then, a silicon nitride film 9 is formed to a thickness of from 3,000 to 8,000 Å, for instance, to a thickness of 5,000 Å, by employing a known plasma CVD process. The silicon nitride film 9 functions as a first interlayer insulator. Silicon oxide can be used in place of the silicon nitride. (FIG. 1C)

Subsequently, a contact hole is formed to source 7 and drain 8 on the silicon nitride film 9. Then, an aluminum alloy film or a multilayer of aluminum and titanium is formed by a known sputtering process. The resulting structure is processed thereafter by means of photolithography to form a source bus line 10 and a drain electrode 11. The upper planar view of the resulting structure is shown in FIG. 2C. Referring to FIG. 2C, a plurality of source bus lines 10 are formed in parallel with each other, and are each individually brought into contact with each of the active layers 4. Furthermore, it can be seen that the source bus lines 10 are provided on the previously formed patterned tantalum light-shield film 2.

Subsequently, a silicon oxide film 12 is formed to a thickness of from 3,000 to 8,000 Å, more specifically, to a thickness of 5,000 Å, by using a known plasma CVD process. The silicon oxide film 12 functions as a second interlayer insulator. Silicon nitride can be used in the place of silicon oxide (FIG. 1D).

A polyimide film is formed thereafter by coating to level the surface. Thus is formed a polyimide film 13. The resulting polyimide film 13 is etched to form a contact hole to the drain electrode 11.

A transparent electrically conductive film, for instance, indium tin oxide (ITO) coating, is formed by a known sputtering method to a thickness of from 500 to 2,000 Å, for example, to a thickness of 1,000 Å, and is processed by a known photolithography process to obtain a pixel electrode 14. The pixel electrode forms a pattern in such a manner that it is superposed to the light-shield film 2. Leakage of light can be prevented from occurring by taking this constitution (FIG. 1E).

Thus is obtained an active matrix circuit. In the present invention, TFT is of an N-channel type, and the light-shield film 2 is formed under the channel of the TFT. To prevent the TFT from being turned ON by the light-shield film 2 at any value of voltage applied to the TFT, the voltage to be applied to the light-shield film 2 must be lower than any possible minimum voltage applied to the source or the drain of the TFT.

A capacitance is formed between the light-shield film 2 and the drain 8 (active layer 4) in this manner. This capacitance functions as an auxiliary capacitance (hold capacitance), because it is provided in parallel with the pixel electrode. As a matter of course, a stable TFT is implemented, because an incident light entering into the channel of the TFT is blocked by the light-shield film 2.

Embodiment 2

Figure 3A:
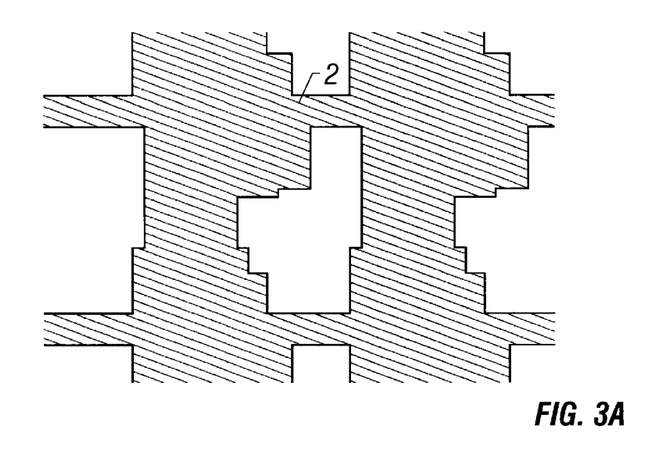
FIGS. 3A to 3C are planar views of the structures of Embodiment 2.

The present embodiment is described below with reference to FIGS. 3A to 3C. The fabrication process of the present embodiment is substantially the same as that described in Embodiment 1, except for the arrangement of, for example, the light-shield film, the bus lines, and the active layer. The numerals provided in FIGS. 3A to 3C correspond to those referred in Embodiment 1.

First, a patterned tantalum light-shield film 2 is formed in a manner similar to that described in Embodiment 1. The resulting structure is shown in FIG. 3A.

Figure 3B:
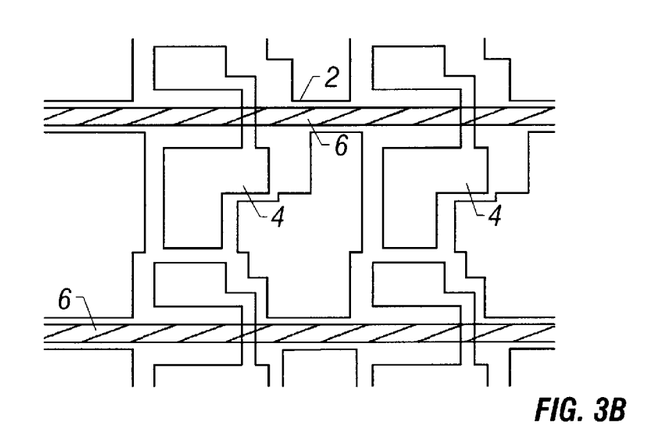
Figure 3C:
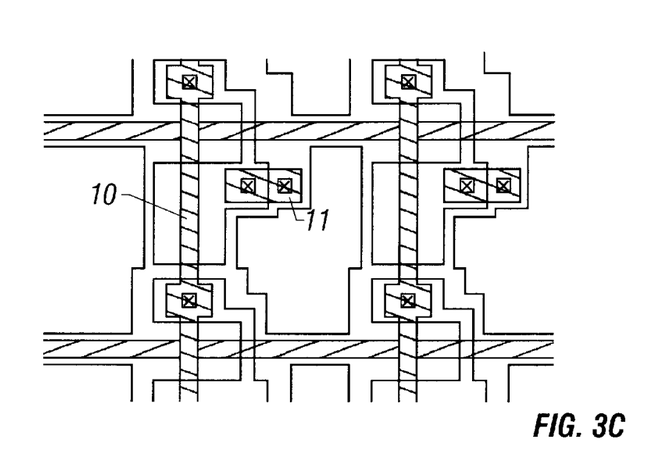

Referring to FIG. 3B, an active layer 4 and a gate bus line 6 are formed next. The gate bus line 6 and the active layer 4 are both provided to the inner side of the light-shield film 2.

Subsequently, a data bus line 10 and a drain electrode 11 are formed. In this step again, the data bus line 10 and the drain electrode 11 are formed to the inner side of the light-shield film 2 (FIG. 3C).

Thus, the active layer, the gate bus line, the data bus line, and the drain electrode are all formed on the inside of the light-shield film 2 so that they may be shielded by the light-shield film 2.

Embodiment 3

Figure 4A:
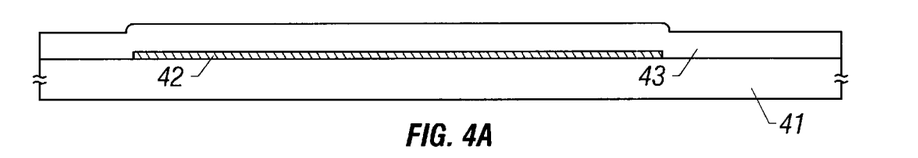
FIGS. 4A to 4E are cross sectional views of the structures of Embodiment 3.
Figure 4B:
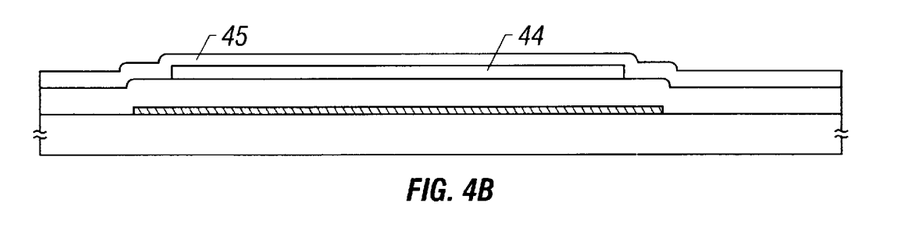
Figure 4C:
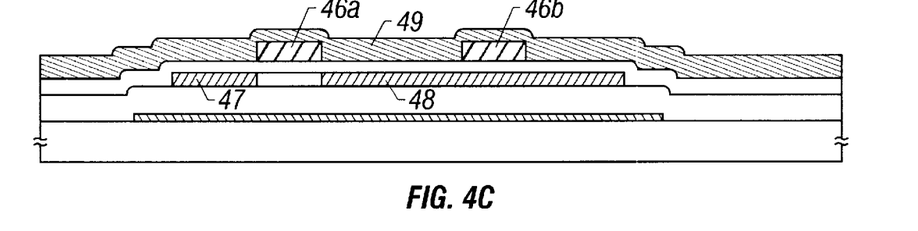
Figure 4D:
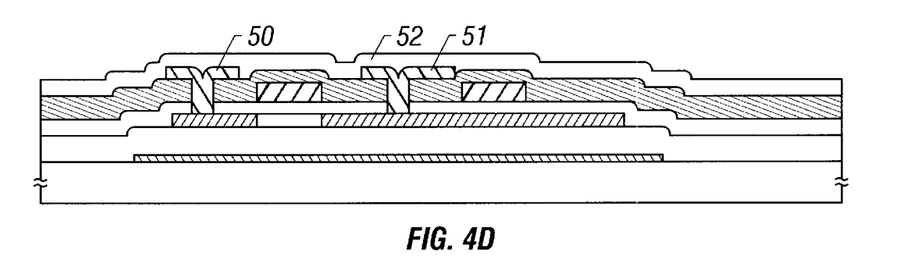
Figure 4E:
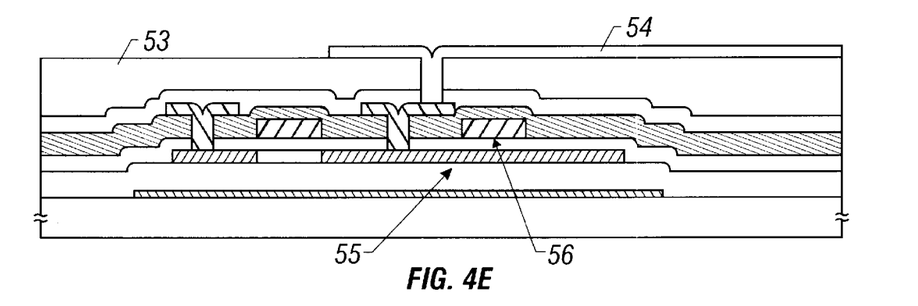
Figure 5A:
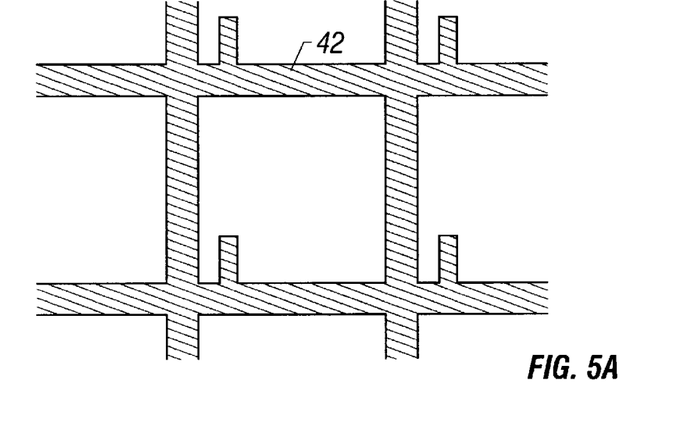
FIGS. 5A to 5C are planar views of the structures of Embodiment 3.
Figure 5B:
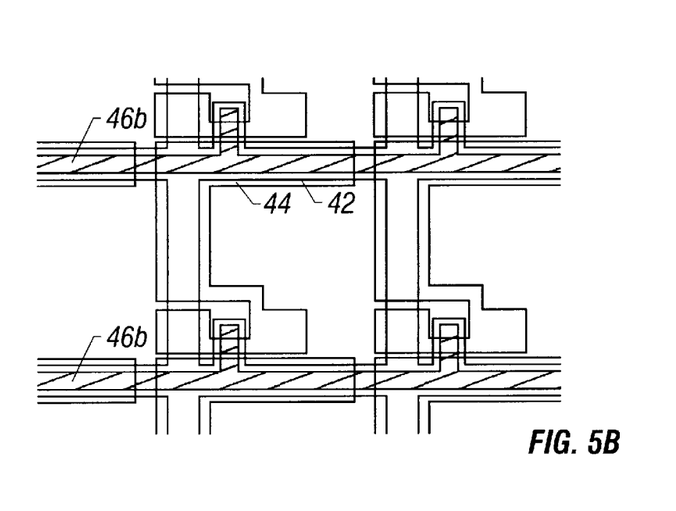
Figure 5C:
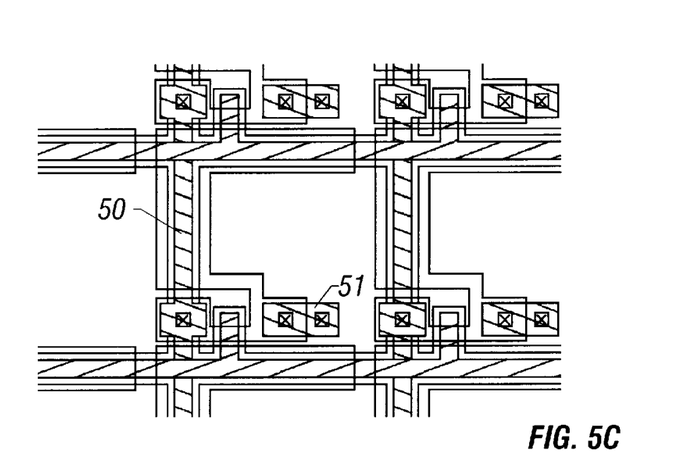

FIGS. 4A to 4E are cross sectional views and FIGS. 5A to 5C are planar views showing the fabrication process according to the present embodiment. A Corning 1737 glass substrate 41 is used in this embodiment. A light-shield film 42 is obtained by first forming a tantalum film on the substrate 41 by sputtering to a thickness of 2,000 Å, and then processing it by using photolithography. Thus is obtained a structure as is shown in the planar view of FIG. 5A. Referring to FIG. 5A, the patterned light-shield film 42 is superposed on the gate bus line (including gate electrode) and the source bus line, and it isolates the pixels.

Then, a 1,500 Å thick silicon oxide film 43 is formed by means of plasma CVD. The silicon oxide film 43 functions as a base insulating film of the TFT (FIG. 4A).

A 800 Å thick amorphous silicon film is formed thereafter by means of low pressure CVD, and is then crystallized by thermal annealing. Then, the crystallized silicon film is isolated into island-like portions by photolithography to obtain an active layer (island-like region) 44. Subsequently, a 1,000 Å thick silicon oxide film 45 is formed by plasma CVD. The silicon oxide film 45 functions as a gate insulating film of the TFT (FIG. 4B).

Then, an N-type impurity is introduced selectively into the active layer 44 by employing ion doping. Recrystallization is effected after the doping process by means of thermal annealing or laser annealing. Thus are obtained a source 47 and a drain 48. Then, a 5,000 Å thick aluminum-titanium alloy film is formed by a known sputtering process, and the resulting film is processed thereafter by means of photolithography to form a gate bus line (a portion which functions as a gate electrode of the present corresponding pixel) 46a and another gate bus line (a portion which functions as the gate electrode of the next line) 46b. The gate bus line 46b is formed in such a manner that it may be superposed on the drain 48 of the active layer 44 of the present corresponding pixel.

FIG. 5B shows the top view of the structure obtained up to this step. Referring to FIG. 5B, a plurality of gate bus lines 46a and 46b are formed in parallel with each other, and are located on the previously formed patterned tantalum light-shield film 42. Further, the active layer 44 is formed such that a part of which is superposed on the previously formed patterned light-shield film 42, and the other part is superposed on the gate bus lines for the next line.

Then, a 5,000 Å thick silicon nitride film 49 is formed by employing plasma CVD. The silicon nitride film 49 functions as a first interlayer insulator. As a modification, silicon oxide can be used in the place of silicon nitride (FIG. 4C).

After forming contact holes in the silicon nitride film 49 in such a manner that they may be connected to the source 47 and the drain 48, a multilayer of aluminum and titanium is formed by a known sputtering process. The resulting structure is processed thereafter by means of photolithography to form a source bus line 50 and a drain electrode 51. The top view of the resulting structure is shown in FIG. 5C. Referring to FIG. 5C, a plurality of source bus lines 50 are formed in parallel with each other, and are each individually brought into contact with each of the active layers 44. Furthermore, it can be seen that the source bus lines 50 are provided on the previously formed patterned tantalum light-shield film 42.

Subsequently, a 5,000 Å thick silicon oxide film 52 is formed by using a known plasma CVD. The silicon oxide film 52 functions as a second interlayer insulator. Silicon nitride can be used in the place of silicon oxide (FIG. 4D).

A polyimide film is formed thereafter as a leveling film 53 on the surface of the resulting structure. The polyimide film is etched to form a contact hole to the drain electrode 51. A 1,500 Å thick indium tin oxide (ITO) film is formed by sputtering, and is processed by photolithography to obtain a pixel electrode 54. The pixel electrode forms a pattern in such a manner that it is superposed on the light-shield film 42. Leakage of light can be prevented from occurring by taking this constitution (FIG. 4E).

Thus is obtained an active matrix circuit. Similar to Embodiment 1, the TFT of the present embodiment is of an N-channel type, and desirably, the voltage to be applied to the light-shield film 42 is lower than any possible minimum voltage applied to the source or the drain of the TFT.

Similar to Embodiment 1, a capacitance 55 (indicated by an arrow in FIG. 4E) is formed between the light-shield film 42 and the drain 48 (active layer 44). Furthermore, a capacitance 56 (indicated by an arrow in FIG. 4E) is formed between the drain 48 and the gate bus line for the next line. When compared with the case of Embodiment 1, an auxiliary capacitance with increased capacity can be formed without lowering the aperture ratio in this embodiment because a part of the capacitance 55 and the capacitance 56 are formed three-dimensionally.

In the present embodiment, another gate bus line for the next line is used to form the capacitance 56. Although there might be a problem of lowering the aperture ratio, a line in the same layer of the gate bus line and having a fixed voltage may be used. In case of utilizing the gate bus line as one of the electrodes for the capacitance, the capacitance is influenced by the gate signal, and the scanning direction of the matrix becomes fixed. By using a line maintained at a voltage independent to the gate signal, the scanning direction can be set arbitrarily either from the upper or the lower side.

Embodiment 4

Figure 6A:
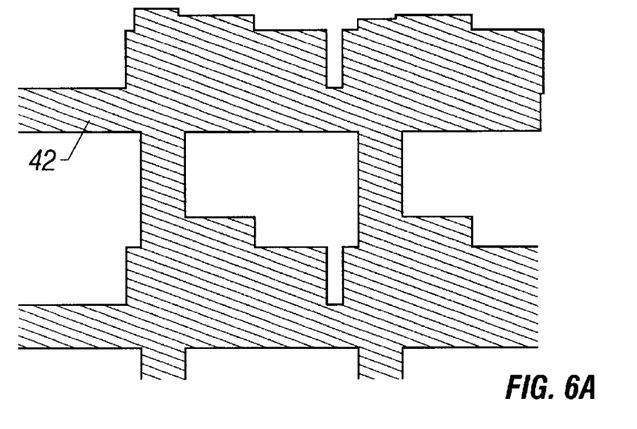
FIGS. 6A to 6C are planar views of the structures of Embodiment 4.

The present embodiment is described below with reference to FIGS. 6A to 6C. The fabrication process of TFT in the present embodiment is substantially the same as that described in Embodiment 2, except for the arrangement of, for example, the light-shield film, the bus lines, and the active layer. The numerals provided in FIGS. 6A to 6C correspond to those referred in Embodiment 2.

First, similar to Embodiment 2, a patterned tantalum light-shield film 42 is formed. The resulting structure is shown in FIG. 6A.

Figure 6B:
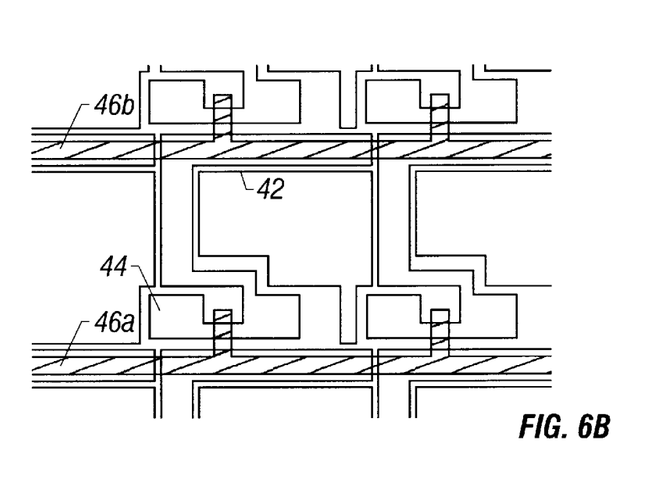

Referring to FIG. 6B, an active layer 44 and a gate bus line 46 are formed next. The gate bus line 46 and the active layer 44 are both provided to the inner side of the light-shield film 42.

Figure 6C:
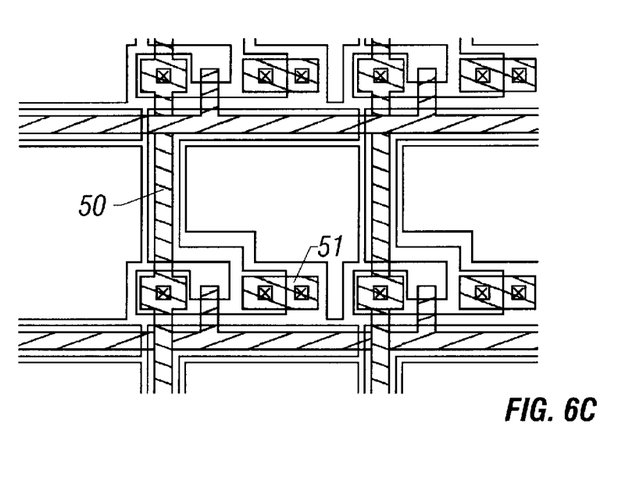

Further, referring to FIG. 6C, a data bus line 50 and a drain electrode 51 are formed. In this step again, the data bus line 50 and the drain electrode 51 are formed to the inner side of the light-shield film 42.

Thus, the active layer 44, the gate bus line 46, the data bus line 50, and the drain electrode 51 are all formed on the inside of the light-shield film 42 so that they may be shielded by the light-shield film 42.

Embodiment 5

Figure 7A:
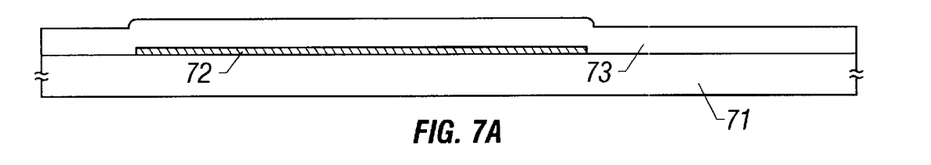
FIGS. 7A to 7E are cross sectional views of the structures of Embodiment 5.
Figure 7B:
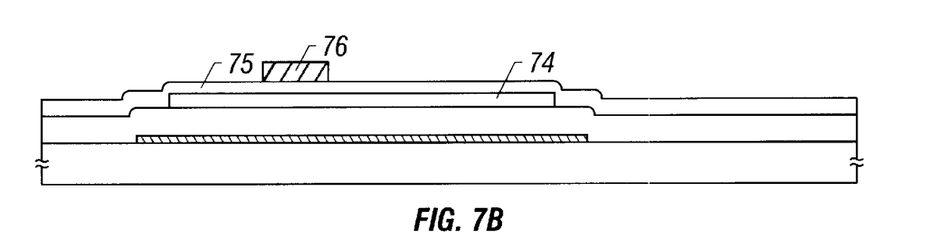
Figure 7C:
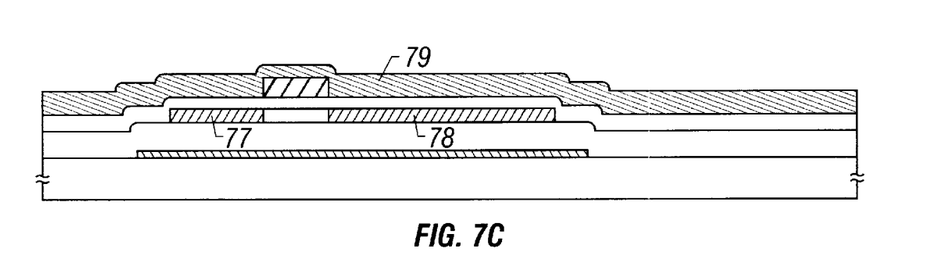
Figure 7D:
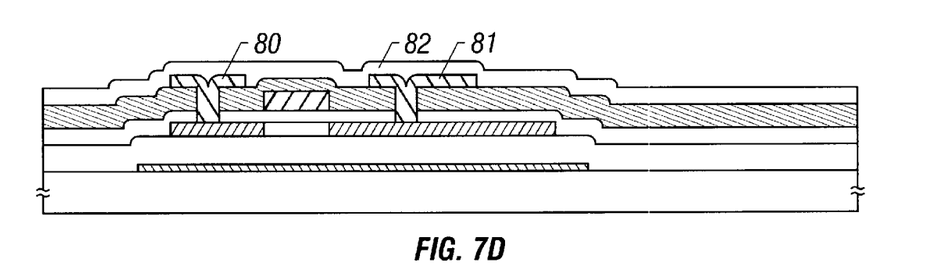
Figure 7E:
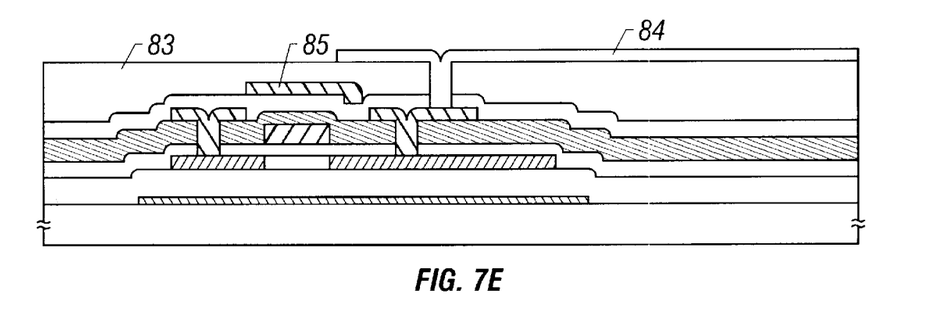
Figure 8A:
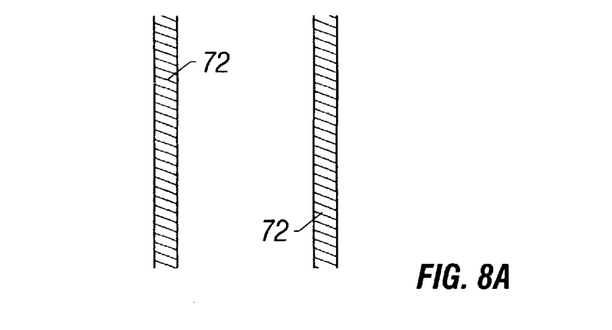
FIGS. 8A to 8D are planar views of the structures of Embodiment 5.
Figure 8B:
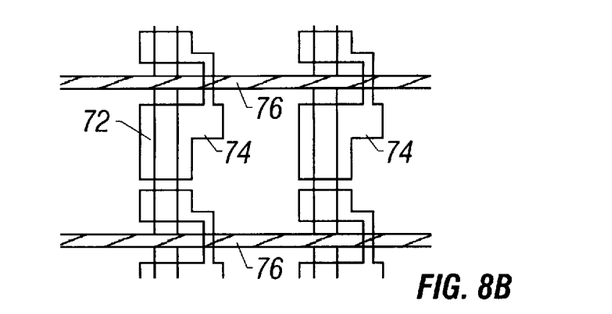
Figure 8C:
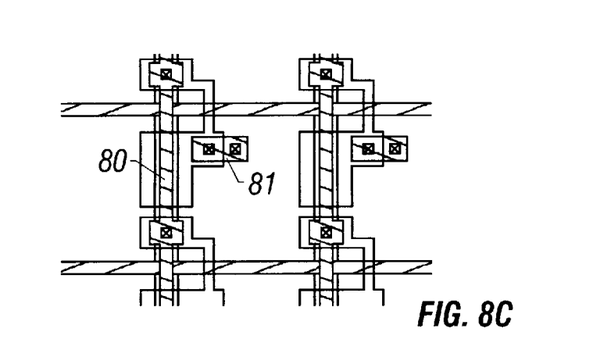

FIGS. 7A to 7E are cross sectional views and FIGS. 8A to 8C are planar views showing the fabrication process according to the present embodiment. A Corning 1737 glass substrate 71 is used in this embodiment. A light-shield film 72 is obtained by first forming a tantalum film on the substrate 71 by sputtering to a thickness of 1,000 Å, and then processing it by using photolithography. Thus is obtained a structure as is shown in the planar view of FIG. 8A. Referring to FIG. 8A, the patterned light-shield film 72 is superposed on the source bus line.

Then, a 2,000 Å thick silicon oxide film 73 is formed by means of plasma CVD. The silicon oxide film 73 functions as a base insulating film of the TFT (FIG. 7A).

A 1,000 Å thick amorphous silicon film is formed thereafter by means of low pressure CVD process, and is then crystallized by laser annealing. Then, the crystallized silicon film is isolated into island-like portions by photolithography to obtain an active layer (island-like region) 74. Subsequently, a 1,200 Å thick silicon oxide film 75 is formed by plasma CVD. The silicon oxide film 75 functions as a gate insulating film of the TFT.

Then, a 5,000 Å thick aluminum-titanium alloy film is formed by a sputtering, and the resulting film is processed thereafter by means of photolithography to form a gate bus line 76 (FIG. 7B).

FIG. 8B shows the top view of the structure obtained up to this step. Referring to FIG. 8B, a plurality of gate bus lines 76 are formed in parallel with each other in such a manner that they may cross at a right angle with the previously formed patterned tantalum light-shield film 72. Moreover, the active layer 74 is formed in such a manner that a part thereof may be superposed on the previously formed patterned light-shield film 72.

Then, an N-type impurity is introduced into the active layer 74 by employing ion doping, and by using the gate bus line 76 as a mask. Recrystallization is effected after the doping process by means of laser annealing. Thus are obtained a source 77 and a drain 78.

Then, a 5,000 Å thick silicon nitride film 79 is formed by employing plasma CVD process. The silicon nitride film 79 functions as a first interlayer insulator. Silicon oxide may be used in the place of silicon nitride (FIG. 7C).

After forming contact holes in the silicon nitride film 79 in such a manner that they may be connected to the source 77 and the drain 78, a multilayer of aluminum and titanium is formed by sputtering. The resulting structure is processed thereafter by means of photolithography to form a source bus line 80 and a drain electrode 81. The top view of the resulting structure is shown in FIG. 8C in this state. Referring to FIG. 8C, a plurality of source bus lines 80 are formed in parallel with each other, and are each individually brought into contact with each of the active layers 74. Furthermore, it can be seen that the source bus lines 80 are provided on the previously formed patterned tantalum light-shield film 72.

Subsequently, a 5,000 Å thick silicon oxide film 82 is formed by using plasma CVD. The silicon oxide film 82 functions as a second interlayer insulator. Silicon nitride can be used in the place of silicon oxide (FIG. 7D).

Figure 8D:
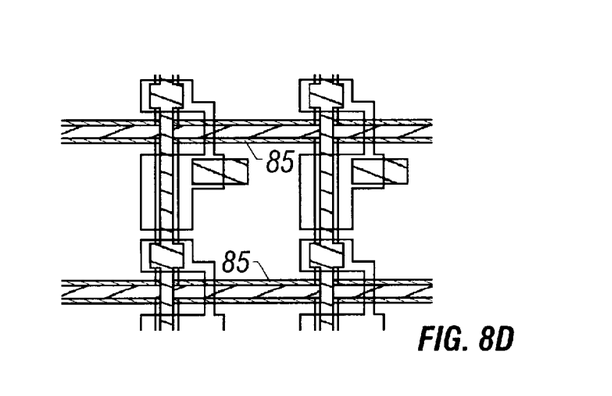

After forming a 1,000 Å thick chromium film by sputtering, the resulting film is patterned to form an upper layer light-shield film 85. The structure viewed from the upper side is shown in FIG. 8D. Referring to FIG. 8D, it can be seen clearly that the upper layer light-shield film 85 is formed in such a manner to cover the gate bus line.

A polyimide film is formed thereafter as a leveling film 83 on the surface of the resulting structure. The polyimide film is etched to form a contact hole to the drain 5 electrode 81. A film of an inorganic material may be provided between the light-shield film 85 and the polyimide film 83 in order to increase adhesiveness. A 1,500 Å thick indium tin oxide (ITO) film is formed thereafter by sputtering, and is processed by photolithography to obtain a pixel electrode 84. The pixel electrode 84 is placed in such a manner that it may be partly superposed on the upper layer light-shield film 85 (FIG. 7E).

Thus is obtained an active matrix circuit. Similar to Embodiments 1 and 3, the TFT of the present embodiment is of an N-channel type. However, because the light-shield film 72 is not superposed on the channel of the active layer for the TFT, the TFT would not be influenced by the TFT. The constitution of the present embodiment is superior to others in this point of view.

In the present embodiment, not only a capacitance is formed between the light-shield film 72 and the drain 78 (active layer 74) in a manner similar to Embodiment 1, but also another capacitance is formed between the light-shield film 85 and the pixel electrode 84 by applying a proper voltage to the upper light-shield film 85. Although the pixel electrode should be prevented from being influenced by the gate bus line 76 which drives the present corresponding pixel, an electrically conductive light-shield film 85 is provided in the manner of covering the gate bus line, coupling of the pixel electrode 84 and the gate bus line 76 can be sufficiently reduced.

In the present embodiment, furthermore, the lower layer light-shield film 72 is provided superposed on the source bus line 80, while the upper layer light-shield film 85 is superposed on the gate bus line 76. However, because there is a sufficient insulating layer between each of the light-shield films and the bus line, the parasitic capacitance can be reduced to the lower limit.

In the constitution according to the present embodiment, the channel portion of the TFT is light-shielded only by the upper layer light-shield film 85. However, a more effective constitution which implements a TFT operating more stably can be realized by providing a pattern such that it may be light-shielded from the lower layer light-shield film 72.

Embodiment 6

The present embodiment is described below with reference to FIGS. 9A to 9D. The fabrication process of TFT in the present embodiment is substantially the same as that described in Embodiment 3, except for the arrangement of, for example, the light-shield film, the bus lines, and the active layer. The numerals provided in FIGS. 9A to 9D correspond to those referred in Embodiment 3.

Figure 9A:
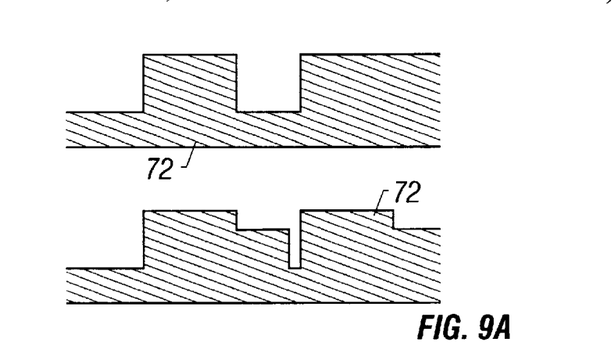
FIGS. 9A to 9D are planar views of the structures of Embodiment 6.

First, similar to Embodiment 3, a patterned tantalum light-shield film 72 is formed in a manner similar to that described in Embodiment 3. The resulting structure is shown in FIG. 9A.

Figure 9B:
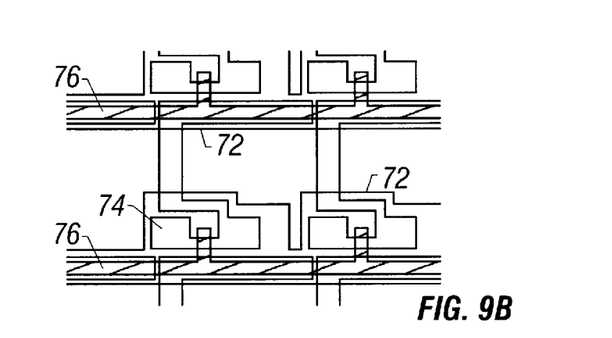

Referring to FIG. 9B, an active layer 74 and a gate bus line 76 are formed next. The gate bus line 76 and the active layer 74 are both provided to the inner side of the light-shield film 72.

Figure 9C:
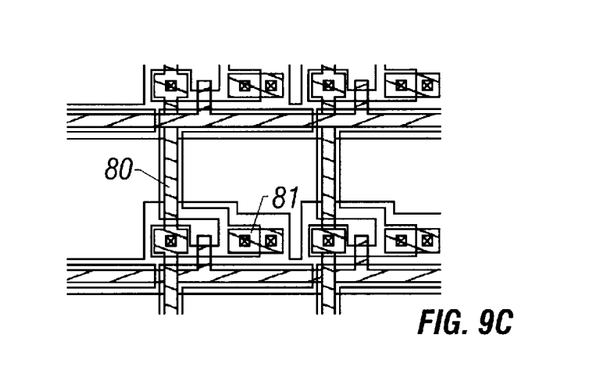

Subsequently referring to FIG. 9C, a data bus line 80 and a drain electrode 81 are formed. In this step again, the data bus line 80 and the drain electrode 81 are formed to the inner side of the light-shield film 72. Thus, the active layer 74, the gate bus line 76, and the drain electrode 81 are all formed on the inside of the light-shield film 72 so that they may be shielded by the light-shield film 72.

Figure 9D:
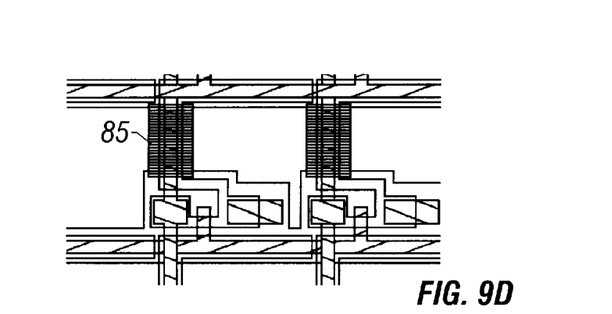

An upper light-shield film 85 are formed thereafter. In the case of the present embodiment, the light-shield film 85 is provided separately. Accordingly, the light-shield film 85 need not conductive, and an insulating one may be formed. Furthermore, the light-shield film 85 is formed in the manner of shielding the data bus line 80. Thus, the data bus line 80 is covered by the light-shield film 72 and the upper layer light-shield film 85 (FIG. 9D).

Similar to the Embodiments 1 to 4 above, the light-shield film 72 in the constitution according to the present embodiment is superposed on the channel of the TFT. Preferably, the applied voltage thereof is lower (for the case of a N-channel TFT) or higher (for the case of a P-channel TFT) than the voltage applied to the source and the drain of the TFT.

Embodiment 7

Figure 10A:
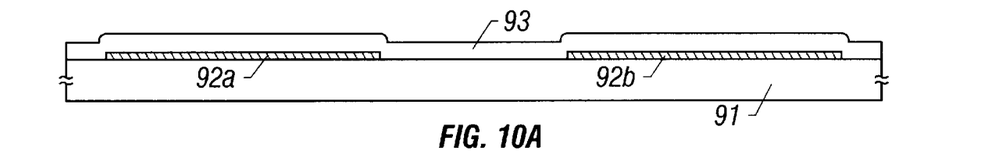
FIGS. 10A to 10F are cross sectional views of the structures of Embodiment 7.

FIGS. 10A to 10F are cross sectional views showing the fabrication process according to the present embodiment. The present constitution comprises using a part of the tantalum film formed originally as the light-shield film as a bonding terminal. A Corning 1737 glass substrate 91 is used in this embodiment. A light-shield film 92b and a bonding terminal electrode 92a are obtained by first forming a tantalum film on the substrate 91 by sputtering to a thickness of 1,000 Å, and then processing it by photolithography. At this stage of fabrication, the patterned bonding terminal electrode 92a and the light-shield film 92b are electrically connected. Then, a 2,000 Å thick silicon oxide film 93 is formed by means of plasma CVD. The silicon oxide film 93 functions as a base insulating film of the TFT (FIG. 10A).

Figure 10B:
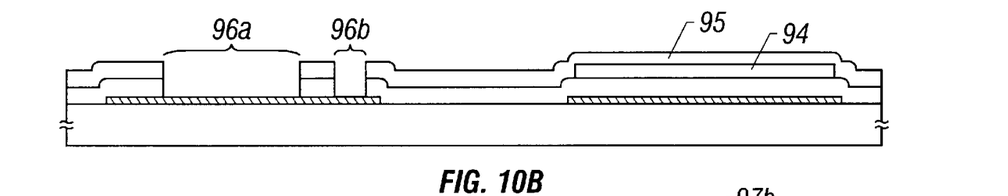

Then, an active layer (island-like region) 94 is obtained by using a crystalline silicon film. A 1,200 Å thick silicon oxide film 95 is formed by plasma CVD. The silicon oxide film 95 functions as a gate insulating film of the TFT.

Then, the silicon oxide films 94 and 95 are etched to form contact holes 96a and 96b in the bonding terminal electrode 92a. The former provides the bonding portion, and the latter takes contact with the gate bus line (FIG. 10B).

Figure 10C:
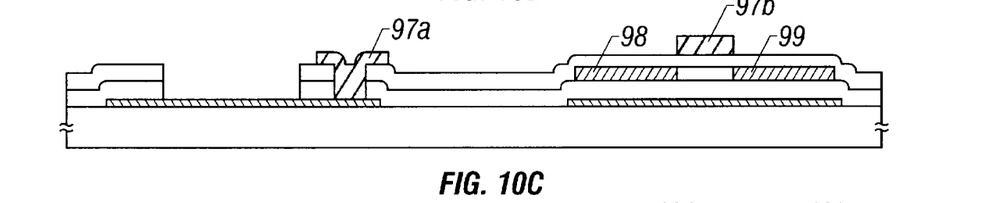

A 5,000 Å thick aluminum-titanium alloy film is formed to form a gate bus lines 97a and 97b. At this stage of the process, the gate bus lines 97a and 97b are electrically connected. Because the gate bus line 97a is in contact with the bonding terminal electrode 92a, the light-shield film 92b, and the gate bus lines 97a and 97b are all maintained at the same voltage. In this manner, the breakdown of the gate insulating film due to charging up phenomenon can be suppressed as much as possible (FIG. 10C).

Figure 10D:
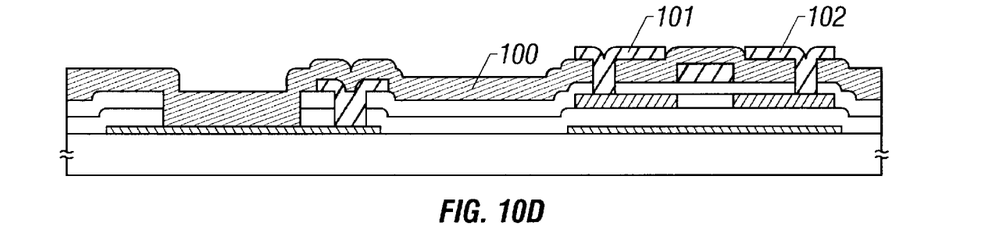

Then, an N-type impurity is introduced into the active layer 94 by ion doping, and by using the gate bus line 97b as a mask. Thus are obtained a source 98 and a drain 99. A 5,000 Å thick silicon nitride film 100 (a first interlayer insulator) is formed thereafter by plasma CVD.

Subsequently, contact holes are formed in the silicon nitride film 100 in such a manner that they may be connected to the source 98 and the drain 99, and a multilayer of aluminum and titanium is formed by sputtering. The resulting structure is processed thereafter by means of photolithography to form a source bus line 101 and a drain electrode 102. Then, the bonding terminal electrode 92a, the light-shield film 92b, and the gate bus lines 97a and 97b are mechanically cut at this stage (FIG. 10D).

Figure 10E:
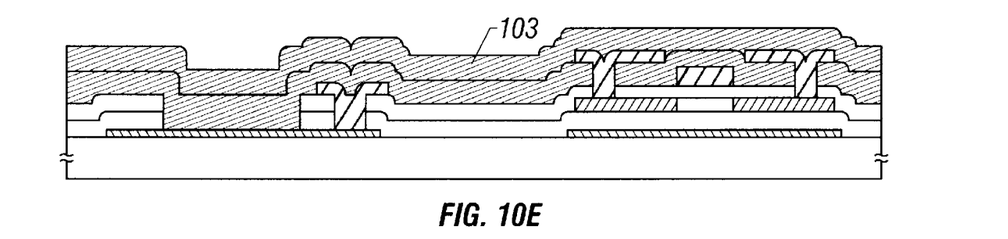

A 3,000 Å thick silicon nitride film 103 (second interlayer insulator) is formed thereafter by using plasma CVD (FIG. 10E).

Figure 10F:
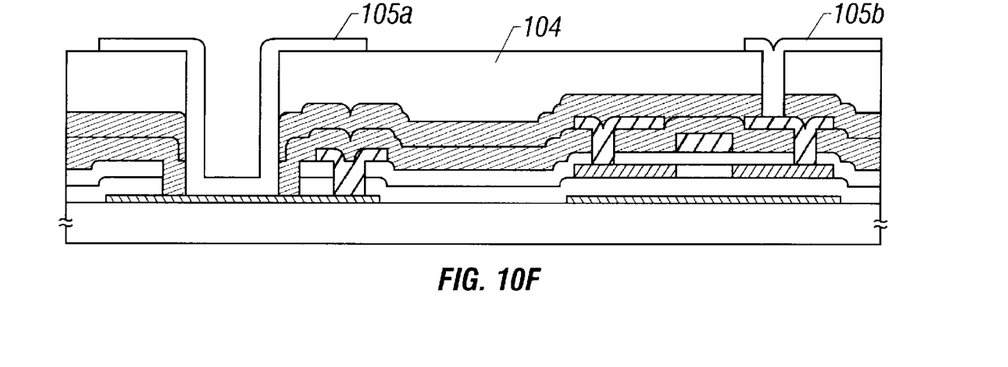

Furthermore, a polyimide film is formed as a leveling film 104 on the surface of the resulting structure. The polyimide film and the two silicon nitride films 100 and 103 are etched to form a contact hole connected to the drain electrode 102 and the bonding terminal electrode 92a. In the present etching step, the drain electrode 102 may function as an etching stopper.

A 1,500 Å thick indium tin oxide (ITO) film is formed thereafter by sputtering, and is processed by photolithography to obtain a bonding terminal 105a and a pixel electrode 105b (FIG. 10F).

Thus is obtained the TFT and the bonding portions of the active matrix circuit. Bonding is formed at the bonding terminal 105a, and preferably, it is effected at the bonding terminal 92a, particularly, at the contact hole 96a. This portion is suitable for use in bonding because it corresponds to the multilayered region of tantalum film and ITO film and is therefore mechanically robust. For instance, a sufficient connection cannot be obtained on the ITO film provided on the interlayer insulator, causing, for instance, peeling off of the film, because the lower interlayer insulator is subject to a variety of stresses. In contrast to this, the base of the contact hole 96a is the substrate itself, and is therefore mechanically very stable.

The present invention enables the use of the light-shield film as an auxiliary capacitance. Although TFTs using crystalline silicon is referred in the foregoing embodiments, it can be clearly understood that other types of TFTs using an amorphous silicon and other semiconductors can be used as well. Furthermore, the (lower layer) light-shield film can be formed by using materials other than tantalum without any problem so long as the material is conductive and resistant to the process steps. Thus, it can be seen that the present invention is industrially useful.

What is claimed is:

1. A liquid crystal display device having an active matrix circuit, said active matrix comprising:
    a top gate-type TFT comprising a semiconductor film;
    a pixel electrode being electrically connected at least a portion of said semiconductor film;
    a first light shield film having a fixed electric potential formed under said semiconductor film;
    at least one of a source bus line and a gate bus line shielded by said light shield film from light;
    a first capacitance formed between the light shield film and said portion of the semiconductor film having an insulating film interposed therebetween; and
    a second light shield film being formed over said TFT, a part of the second light shield film being overlapped with the first light shield film.

2. A device according to claim 1 further comprising another gate bus line,
    wherein a second capacitance is formed between said semiconductor film and said another gate bus line.

3. A device according to claim 1 wherein the first light shield film is wider than at least one of the source bus line and the gate bus line.

4. A device according to claim 1 wherein said semiconductor film extends along said one of the source bus line and the gate bus line.

5. A device according to claim 1 wherein said first capacitance is formed between said light shield film and drain region in said semiconductor film of the TFT.

6. A semiconductor device comprising:
- a first light shield film formed on a substrate;
- a semiconductor film formed over said light shield film having a first insulating film therebetween, said semiconductor film including source and drain region and a channel region;
- a first wiring formed over said channel region having a second insulating film therebetween; and
- a second light shielding film formed over said first wiring interposed a third insulating film therebetween, a part of said second light shielding film being overlapped with said first light shielding film,
- wherein a first capacitance is formed between said first light shield film and said semiconductor film.

7. A device according to claim 6 further comprising a second wiring shielded by said light shielding film,
wherein said semiconductor film extends along said second wiring.

8. A device according to claim 6 wherein said first capacitance is formed between said first light shielding film and said drain region in the semiconductor film.

9. A liquid crystal display device comprising:
- a first light shield film formed on a substrate;
- a semiconductor film formed over said first light shield film having a first insulating film therebetween, said semiconductor layer including source and drain region and a channel region;
- a first wiring formed over said channel region having a second insulating film therebetween;
- a second wiring formed over said source region having said second insulating film and a third insulating film therebetween, said second wiring being connected to said source region through a first opening;
- an electrode formed over said drain region having said second insulating film and said third insulating film therebetween, said electrode being connected to said drain region through a second opening;
- a second light shield film formed over said first wiring having said third insulating film and a fourth insulating film therebetween;
- a leveling film covering said fourth insulating film and said second light shield film; and
- a pixel electrode formed on said leveling film, said pixel electrode being connected to said electrode through a third opening,
- wherein a first capacitance is formed between said first light shield film and said semiconductor film and a second capacitance is formed between said second light shield film and said pixel electrode.

10. A liquid crystal display device comprising:
- at least a first gate line and a second gate line;
- at least a source line;
- a first light shielding film extending along and overlapping the source line, the first gate line, and the second gate line;
- a thin film transistor comprising a semiconductor film, a gate insulating film, and a gate electrode, said thin film transistor being operationally connected to the source line and the first gate line while not being connected to the second gate line, wherein a first portion of said semiconductor film is located between the source line and the first light shielding film with insulating films interposed therebetween and a second portion of said semiconductor film is located between the second gate line and the first light shielding film with the insulating films therebetween;
- a first capacitor formed between at least said first portion of the semiconductor film and the first light shielding film; and
- a second capacitor formed between at least a second portion of the semiconductor film and the first light shielding film.

* * * * *